United States Patent
Yoon et al.

(10) Patent No.: US 12,490,642 B2
(45) Date of Patent: Dec. 2, 2025

(54) DISPLAY APPARATUS

(71) Applicant: SAMSUNG DISPLAY CO., LTD., Yongin-si (KR)

(72) Inventors: Jangyeol Yoon, Yongin-si (KR); Seongwon Kim, Yongin-si (KR); Jiwon Lee, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 492 days.

(21) Appl. No.: 17/888,928

(22) Filed: Aug. 16, 2022

(65) Prior Publication Data

US 2023/0070570 A1    Mar. 9, 2023

(30) Foreign Application Priority Data

Sep. 9, 2021   (KR) .......................... 10-2021-0120543

(51) Int. Cl.
| | | |
|---|---|---|
| *H01L 27/32* | (2006.01) | |
| *H10K 59/121* | (2023.01) | |
| *H10K 77/10* | (2023.01) | |
| *H10K 59/35* | (2023.01) | |
| *H10K 102/00* | (2023.01) | |

(52) U.S. Cl.
CPC ....... *H10K 77/111* (2023.02); *H10K 59/1213* (2023.02); *H10K 59/353* (2023.02); *H10K 2102/311* (2023.02)

(58) Field of Classification Search
CPC ...................... H10K 77/111; H10K 2102/311
See application file for complete search history.

(56) References Cited

U.S. PATENT DOCUMENTS

| | | | | |
|---|---|---|---|---|
| 3,648,452 | A | * | 3/1972 | Young ........................ C08J 5/06 57/902 |
| 2014/0144480 | A1 | | 5/2014 | Lee |
| 2016/0295689 | A1 | * | 10/2016 | Chang .................. H05K 1/0283 |
| 2017/0229665 | A1 | * | 8/2017 | Park ..................... H10K 50/844 |
| 2018/0053451 | A1 | | 2/2018 | Han |

(Continued)

FOREIGN PATENT DOCUMENTS

| | | |
|---|---|---|
| CN | 109830510 A | 5/2019 |
| CN | 112133198 A | 12/2020 |

(Continued)

OTHER PUBLICATIONS

Written Decision on Registration, Korean Intellectual Property Office, Korean Application No. KR10-2021-0120543, dated May 27, 2025. (Year: 2025).*

(Continued)

*Primary Examiner* — Victoria K. Hall
(74) *Attorney, Agent, or Firm* — CANTOR COLBURN LLP

(57) ABSTRACT

A display apparatus includes a display panel including a base portion and a plurality of connection portions extending from the base portion in different directions, and a first member disposed on a surface of the display panel and including a first portion overlapping the base portion of the display panel and a second portion overlapping the plurality of connection portions of the display panel, where a modulus of the second portion of the first member is less than a modulus of the first portion of the first member.

21 Claims, 15 Drawing Sheets

(56) References Cited

U.S. PATENT DOCUMENTS

| | | | |
|---|---|---|---|
| 2020/0035778 A1* | 1/2020 | Kim | .................... H10K 59/1275 |
| 2020/0051964 A1* | 2/2020 | Jung | .................... H01L 25/167 |
| 2020/0111390 A1* | 4/2020 | Kim | ........................ G09F 9/301 |
| 2020/0144522 A1* | 5/2020 | Jung | .................... H10K 59/131 |
| 2020/0168641 A1 | 5/2020 | Wang et al. | |
| 2020/0201393 A1* | 6/2020 | Ahn | ........................ G09F 9/301 |
| 2020/0212364 A1 | 7/2020 | Kim et al. | |
| 2024/0324335 A1* | 9/2024 | Xue | .................... H10K 59/131 |

FOREIGN PATENT DOCUMENTS

| | | | | | |
|---|---|---|---|---|---|
| CN | 112562515 A | | 3/2021 | | |
| KR | 20170072973 A | | 6/2017 | | |
| KR | 1020170072973 A | * | 6/2017 | ............... | G09F 9/30 |
| KR | 20180021299 A | | 3/2018 | | |
| KR | 1020200082015 A | | 7/2020 | | |
| KR | 1020210034335 A | | 3/2021 | | |
| KR | 20210052699 A | | 5/2021 | | |
| KR | 1020210052699 A | * | 5/2021 | ........... | G06F 3/0412 |

OTHER PUBLICATIONS

Machine translation, Song, Korean Pat. Pub. No. KR1020170072973A, translation date: Aug. 6, 2025; Espacenet, all pages. (Year: 2025).*
Machine translation, Ku, Korean Pat. Pub. No. KR1020210052699A, translation date: Aug. 6, 2025; Espacenet, all pages. (Year: 2025).*

* cited by examiner

DISPLAY APPARATUS

This application claims priority to Korean Patent Application No. 10-2021-0120543, filed on Sep. 9, 2021, and all the benefits accruing therefrom under 35 U.S.C. § 119, the content of which in its entirety is herein incorporated by reference.

BACKGROUND

1. Field

Embodiments relate to a display apparatus.

2. Description of the Related Art

Mobile electronic devices are being widely used. In addition to small electronic devices such as mobile phones, tablet personal computers are being widely used as mobile electronic devices.

Such mobile electronic devices include a display apparatus for providing a user with visual information such as an image or video. A proportion of space occupied by the display apparatus to that of the mobile electronic device is being increasing, and various display apparatuses having excellent characteristics such as thinness, light weight, and low power consumption are being introduced.

Recently, research and development is being carried out on flexible display apparatuses that may be bent, folded, or rolled. Further, research and development are being actively conducted on stretchable display apparatuses that may be changed into various shapes.

SUMMARY

Embodiments include a display apparatus that is highly contractible and stretchable. However, such a technical feature is one of technical features, and the invention is not limited thereto.

Additional features will be set forth in part in the description which follows and, in part, will be apparent from the description, or may be learned by practice of the presented embodiments of the invention.

According to an embodiment of the invention, a display apparatus includes a display panel including a base portion and a plurality of connection portions extending from the base portion in different directions, and a first member disposed on a surface of the display panel and including a first portion overlapping the base portion of the display panel and a second portion overlapping the plurality of connection portions of the display panel, where a modulus of the second portion of the first member is less than a modulus of the first portion of the first member.

In an embodiment, the display apparatus may further include a second member disposed on a first surface of the first member and overlapping the first portion and the second portion of the first member, the first surface of the first member being opposite to a second surface of the first member facing the surface of the display panel, where a modulus of the second member may be less than a modulus of the first portion of the first member.

In an embodiment, the second portion of the first member may include elastomer having a positive Poisson's ratio.

In an embodiment, an area size of the first portion of the first member may be equal to or greater than an area size of the base portion of the display panel.

In an embodiment, a thickness of the first member may be about 1 micrometer (µm) to about 1000 µm.

In an embodiment, a surface of the second portion of the first member facing the display panel may be attached to the plurality of connection portions of the display panel.

In an embodiment, the display apparatus may further include an adhesive layer between the display panel and the first member.

In an embodiment, the first portion may be provided in plural to comprise a plurality of first portions, where the second portion may be disposed between adjacent first portions of a plurality of first portions arranged side by side, where, when the adjacent first portions come close to each other in a direction along which the adjacent first portions are arranged side by side, a thickness of the second portion may increase in a direction perpendicular to the direction along which the adjacent first portions are arranged side by side.

In an embodiment, the first member may further include a third portion overlapping each of the plurality of connection portions of the display panel and having a different modulus from a modulus of the second portion of the first member.

In an embodiment, the third portion of the first member may be closer to a second surface of the first member facing the display panel than to a first surface of the first member opposite to the second surface of the first member in a cross-sectional view.

In an embodiment, a length of the third portion of the first member in a first direction may be equal to or less than a length of a corresponding connection portion from among the plurality of connection portions of the display panel in the first direction.

In an embodiment, the third portion of the first member may be provided in plural to comprise a plurality of third portions, and the plurality of third portions may be arranged in a first direction and a second direction crossing the first direction in a plan view.

In an embodiment, the third portion of the first member may include a 3-1 portion and a 3-2 portion spaced apart from each other and having different area sizes from each other in a plan view.

In an embodiment, the third portion of the first member may include a 3-3 portion and a 3-4 portion spaced apart from each other in a plan view and having different Poisson's ratios from each other.

According to an embodiment of the invention, a display apparatus includes a substrate including a first area and a plurality of second areas extending from the first area in different directions, a pixel circuit disposed in the first area of the substrate and including a plurality of thin-film transistors and a storage capacitor, a light-emitting device disposed in the first area of the substrate and electrically connected to the pixel circuit, wiring which is disposed in a second area of the plurality of second areas of the substrate and applies an electrical signal to the pixel circuit, a first member disposed on a surface of the substrate and including a first portion overlapping the first area of the substrate and a second portion overlapping the plurality of second areas of the substrate, and a second member disposed on a first surface of the first member, the first surface of the first member being opposite to a second surface of the first member facing the surface of the substrate, where a modulus of the second portion of the first member and a modulus of the second member are less than a modulus of the first portion.

In an embodiment, an area size of the first portion of the first member may be equal to or greater than an area size of the first area of the substrate.

In an embodiment, a thickness of the first member may be about 1 µm to about 1000 µm.

In an embodiment, a surface of the second portion of the first member facing the substrate may be attached to the plurality of second areas of the substrate.

In an embodiment, the first member may further include a third portion overlapping each of the plurality of second areas of the substrate and having a different modulus from a modulus of the second portion of the first member.

In an embodiment, the third portion of the first member may be closer to a first surface of the first member facing the substrate than to a second surface of the first member opposite to the first surface of the first member in a cross-sectional view.

In an embodiment, a length of the third portion of the first member in a first direction may be equal to or less than a length of a corresponding second area from among the plurality of second areas of the substrate in the first direction.

In an embodiment, the third portion of the first member may be provided in plural to comprise a plurality of third portions, and the plurality of third portions may be arranged in a first direction and a second direction crossing the first direction in a plan view.

In an embodiment, the third portion of the first member may include a 3-1 portion and a 3-2 portion spaced apart from each other and having different area sizes from each other in a plan view.

These general and predetermined embodiments may be implemented using a system, a method, a computer program, or any combinations thereof.

BRIEF DESCRIPTION OF THE DRAWINGS

The above and other features and advantages of embodiments of the invention will be more apparent from the following description taken in conjunction with the accompanying drawings, in which.

DETAILED DESCRIPTION

Figure 1:
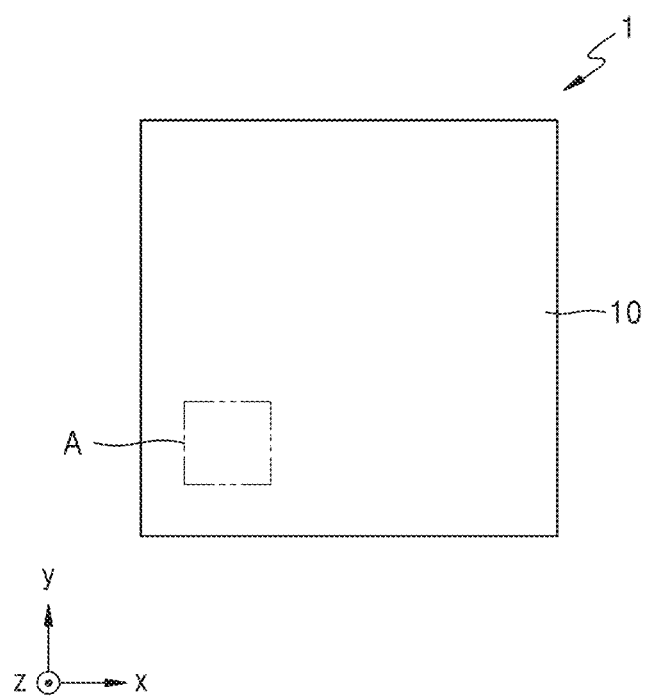
FIG. 1 is a schematic plan view of an embodiment of a display apparatus.

Reference will now be made in detail to embodiments, examples of which are illustrated in the accompanying drawings, where like reference numerals refer to like elements throughout. In this regard, the embodiments may have different forms and should not be construed as being limited to the descriptions set forth herein. Accordingly, the embodiments are merely described below, by referring to the drawing figures, to explain features of the description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

As the description allows for various changes and numerous embodiments, certain embodiments will be illustrated in the drawings and described in the written description. Effects and features of one or more embodiments and methods of accomplishing the same will become apparent from the following detailed description of the one or more embodiments, taken in conjunction with the accompanying drawings. However, the embodiments may have different forms and should not be construed as being limited to the descriptions set forth herein.

Embodiments will be described below in more detail with reference to the accompanying drawings. Those elements that are the same or are in correspondence with each other are rendered the same reference numeral regardless of the figure number, and redundant descriptions thereof are omitted.

While such terms as "first" and "second" may be used to describe various elements, such elements must not be limited to the above terms. The above terms are used only to distinguish one element from another.

The singular forms "a," "an," and "the" as used herein are intended to include the plural forms as well unless the context clearly indicates otherwise.

It will be understood that the terms "include," "comprise," and "have" as used herein specify the presence of stated features or elements but do not preclude the addition of one or more other features or elements.

It will be further understood that, when a layer, region, or element is referred to as being on another layer, region, or element, it may be directly or indirectly on the other layer, region, or element. That is, for example, intervening layers, regions, or elements may be present.

Sizes of elements in the drawings may be exaggerated or reduced for convenience of explanation. In other words, since sizes and thicknesses of elements in the drawings are arbitrarily illustrated for convenience of explanation, the following embodiments are not limited thereto.

When an embodiment may be implemented differently, a certain process order may be performed differently from the described order. Two consecutively described processes may be performed substantially at the same time or performed in an order opposite to the described order, for example.

As used herein, the expression "A and/or B" refers to A, B, or A and B. In addition, the expression "at least one of A and B" refers to A, B, or A and B.

It will be further understood that, when layers, regions, or elements are referred to as being connected to each other, they may be directly connected to each other or may be indirectly connected to each other with intervening layers, regions, or elements therebetween. When layers, regions, or elements are referred to as being electrically connected to each other, they may be directly electrically connected to each other or may be indirectly electrically connected to each other with intervening layers, regions, or elements therebetween, for example.

The x-axis, the y-axis, and the z-axis are not limited to three axes of the rectangular coordinate system and may be interpreted in a broader sense. The x-axis, the y-axis, and the z-axis may be perpendicular to one another or may represent different directions that are not perpendicular to one another, for example.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). The term "about" can mean within one or more standard deviations, or within ±30%, 20%, 10%, 5% of the stated value, for example.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the invention, and will not be interpreted in an idealized or overly formal sense unless expressly so defined herein.

Figure 2:
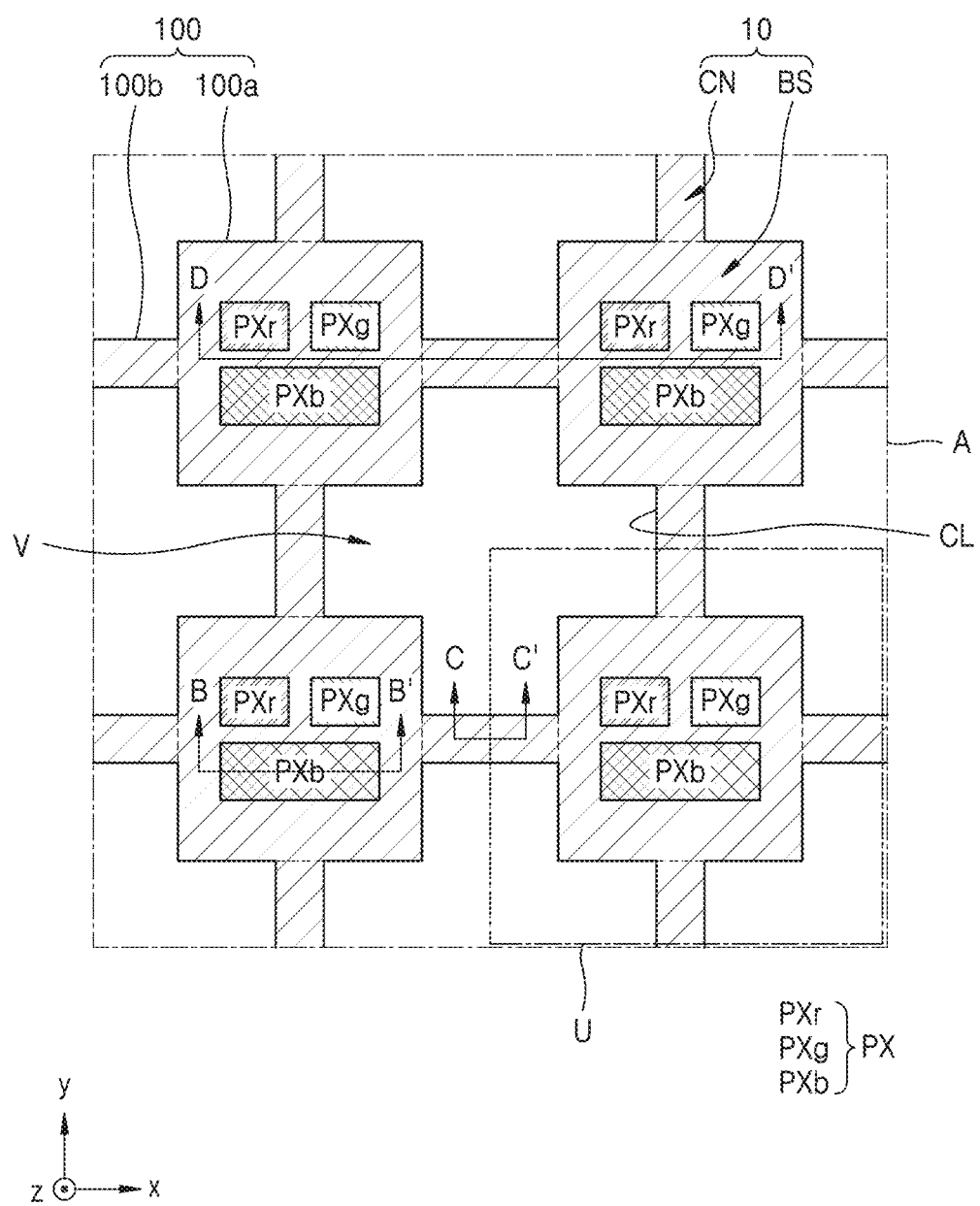
FIG. 2 is an enlarged plan view schematically illustrating region A of the display apparatus of FIG. 1.

FIG. 1 is a schematic plan view of an embodiment of a display apparatus 1. FIG. 2 is an enlarged plan view schematically illustrating region A of the display apparatus 1 of FIG. 1.

Referring to FIGS. 1 and 2, the display apparatus 1 may include a display panel 10 for providing an image. In an embodiment, the display panel 10 may include a plurality of base portions BS spaced apart from one another and a plurality of connection portions CN through which the plurality of base portions BS is extended to one another. The plurality of base portions BS and the plurality of connection portions CN may define a plurality of separation regions V penetrating the display panel 10.

The plurality of base portions BS may be spaced apart from one another. In an embodiment, the plurality of base portions BS may form a planar grid pattern repeatedly arranged in a first direction (e.g., a direction x) and a second direction (e.g., a direction y) different from the first direction (e.g., the direction x), for example. In an embodiment, the first direction and the second direction may be perpendicular to each other. In another embodiment, the first direction and the second direction may define an obtuse angle or an acute angle.

Each base portion BS of the display panel 10 may include a pixel PX. The pixel PX may be defined as an emission area where light in a visible light band is emitted by a light-emitting device included in the display panel 10. That is, a light-emitting device of the display panel 10 may be in the base portion BS, and a pixel circuit for driving the light-emitting device may also be in the base portion BS. The display panel 10 may provide an image by light emitted from the pixel PX.

The pixel PX may be a sub-pixel, and in an embodiment, the pixel PX may include a red pixel PXr, a green pixel PXg and/or a blue pixel PXb. In another embodiment, the pixel PX may include the red pixel PXr, the green pixel PXg, the blue pixel PXb and/or a white pixel. In an embodiment, as shown in FIG. 2, each base portion BS may include all of the red pixel PXr, the green pixel PXg, and the blue pixel PXb, for example, but the invention is not limited thereto. Arrangements of the pixel PX may be variously modified.

The plurality of connection portions CN may extend to neighboring base portions BS so that the neighboring base portions BS extend to each other through the connection portions CN. In an embodiment, four connection portions CN may be connected to each base portion BS, for example. The plurality of connection portions CN may extend from each base portion BS in different directions. In an embodiment, four connection portions CN extended from one base portion BS may extend in different directions, and each connection portion CN may be extended to another base portion BS adjacent to the one base portion BS, for example. One base portion BS may be extended to four base portions BS arranged in a direction surrounding the one base portion BS through four connection portions CN.

The plurality of connection portions CN may be contractible and/or stretchable. In an embodiment, the plurality of connection portions CN may include a contractible and/or stretchable material. In an embodiment, the plurality of connection portions CN may be highly contractible and/or stretchable, compared to the plurality of base portions BS. In this case, the plurality of connection portions CN may be deformed in a third direction (e.g., a direction z), and adjacent base portions BS may be closer to or farther away from each other. Accordingly, the display apparatus 1 may be stretchable and/or contractible. In an embodiment, the display apparatus 1 may be contracted and/or stretched in the first direction (e.g., the direction x) and/or the second direction (e.g., the direction y), for example.

In an embodiment, the plurality of base portions BS and the plurality of connection portions CN may continuously include the same material. That is, the plurality of base portions BS and the plurality of connection portions CN may be unitary with each other as one body. In another embodiment, the plurality of base portions BS and the plurality of connection portions CN may include different materials from each other.

The display panel 10 may include a substrate 100, and various elements constituting the display panel 10 may be arranged on the substrate 100. In an embodiment, the substrate 100 of the display panel 10 may include various materials such as glass, metal, or an organic material. In an embodiment, the substrate 100 may include a flexible material. In an embodiment, the substrate 100 may include ultra-thin flexible glass (e.g., several tens to hundreds of μm in thickness) or polymer resin, for example.

The substrate 100 of the display panel 10 may include a first area 100a corresponding to the base portion BS of the display panel 10 and a second area 100b corresponding to the connection portion CN. That is, the substrate 100 may include a plurality of first areas 100a spaced apart from one another and a plurality of second areas 100b connecting the plurality of first areas 100a to one another. The plurality of second areas 100b may extend from the first area 100a in different directions. The pixel circuit and the light-emitting device of the display panel 10 may be arranged in the first area 100a of the substrate 100. Wiring for applying an electrical signal to the pixel circuit may be arranged in the second area 100b of the substrate 100.

Hereinafter, for convenience of description, one base portion BS of the display panel 10 and connection portions CN extended thereto will be referred to as one basic unit U, and a structure of the display panel 10 will be described in more detail using this. The basic unit U may be repeatedly arranged in the first direction and the second direction, and it will be understood that the display panel 10 is provided in which repeatedly arranged basic units U are extended to each other. Two basic units U adjacent to each other may be symmetrical to each other. In an embodiment, in FIG. 2, two basic units U horizontally adjacent to each other may be horizontally symmetrical with respect to an axis of symmetry therebetween parallel to the direction y, for example. Similarly, in FIG. 2, two basic units U vertically adjacent to each other may be vertically symmetrical with respect to an axis of symmetry therebetween parallel to the direction x.

Basic units U adjacent to each other, for example, four basic units U shown in FIG. 2, from among the plurality of basic units U may form a closed line CL therebetween, and the closed line CL may define a separation region V that is an empty space. In an embodiment, the separation region V may be defined by the closed line CL including edges of the plurality of base portions BS and edges of the plurality of connection portions CN, for example.

Each separation region V may penetrate upper and lower surfaces of the substrate 100 and/or the display panel 10. Each separation region V may provide a separation region between the plurality of base portions BS, decrease a weight of the display panel 10, and improve the flexibility of the display panel 10. In addition, when an external force (twisting, bending, pulling, or compressing force) is applied to the display panel 10, shapes of the separation regions V may change, thereby easily reducing the generation of stress during deformation of the display panel 10. Thus, when the display panel 10 is used, a user's convenience may be improved, and the display panel 10 may be easily applied to a wearable device.

The separation region V may be defined by removing a region of the substrate 100 through etching or the like, or in another example, the substrate 100 may be formed or provided so as to define the separation region V when the substrate 100 is manufactured. A process of defining the separation region V in elements of the substrate 100 may have various examples, and a manufacturing method thereof has no limitations.

Figure 3A:
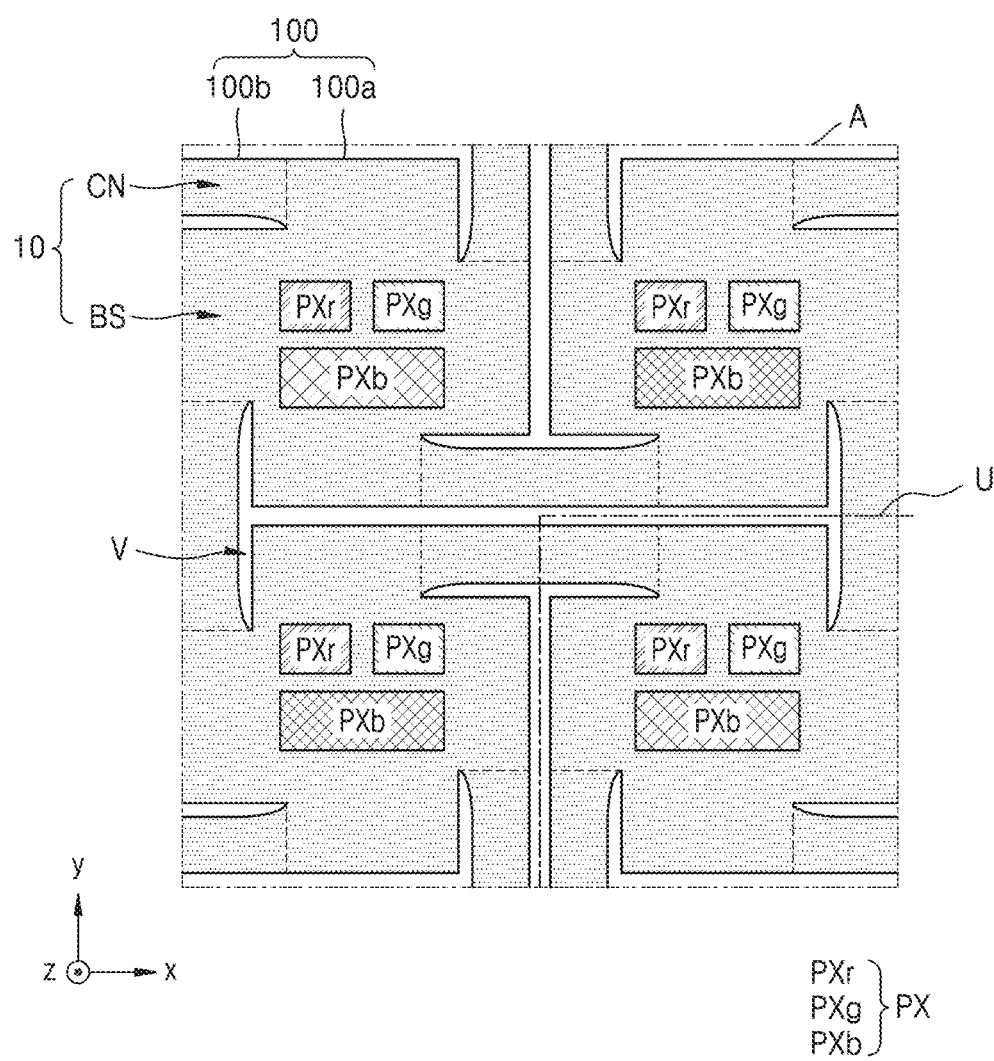
FIGS. 3A and 3B are plan views schematically illustrating comparative examples of region A of the display apparatus of FIG. 1.
Figure 3B:
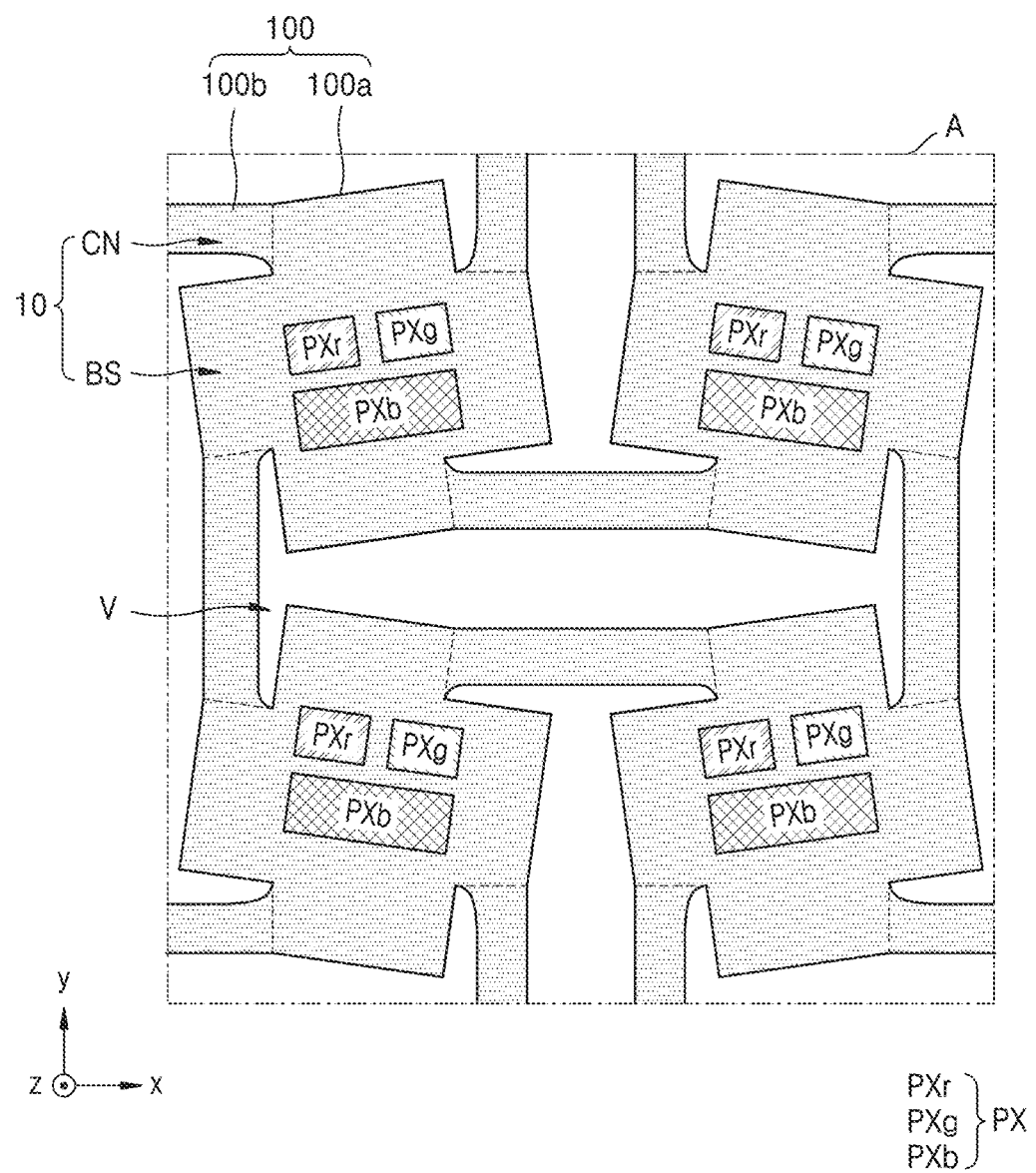

FIGS. 3A and 3B are plan views schematically illustrating comparative examples of region A of the display apparatus 1 of FIG. 1. FIG. 3A shows a state before rotation of the plurality of base portions BS, and FIG. 3B shows a state after rotation of the plurality of base portions BS.

Referring to FIGS. 3A and 3B, the plurality of connection portions CN and the plurality of base portions BS may not include a stretchable and/or contractible material. Even in this case, the display panel 10 may be stretched through rotation of the plurality of base portions BS. However, unlike embodiments of the invention, when the plurality of connection portions CN does not include a contractible and/or stretchable material, the display panel 10 may only be biaxially stretched in a first direction (e.g., the direction x) and a second direction (e.g., the direction y) but may not be uniaxially stretched. In other words, the display panel 10 may not be stretched only in the first direction (e.g., the direction x) or the second direction (e.g., the direction y). In addition, when the display panel 10 is relatively highly stretched, the display panel 10 may have cracks or three-dimensional distortion.

In the illustrated embodiment, the display panel 10 may be uniaxially stretched because the plurality of connection portions CN includes a contractible and/or stretchable material. In addition, the plurality of connection portions CN may be deformed in a third direction (e.g., the direction z). Accordingly, cracks or three-dimensional distortion in the display panel 10 may be prevented or reduced from occurring.

Figure 4:
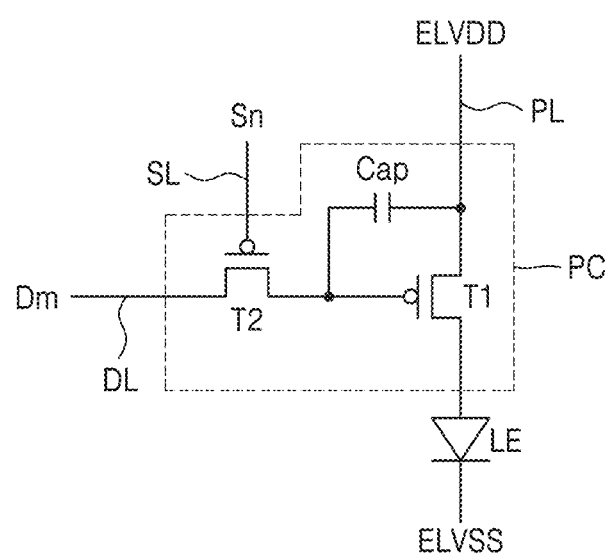
FIG. 4 is an equivalent circuit diagram of an embodiment of a pixel circuit of a display apparatus.

FIG. 4 is an equivalent circuit diagram of an embodiment of a pixel circuit PC of a display apparatus.

Referring to FIG. 4, the display apparatus 1 (refer to FIG. 1) may include the pixel circuit PC and a light-emitting device LE electrically connected to the pixel circuit PC. The light-emitting device LE may receive a driving current through the pixel circuit PC and emit light, and for example, may emit red, green, or blue light. As described above, an emission area where the light-emitting device LE emits light may be defined as the pixel PX (refer to FIG. 2).

The light-emitting device LE may include an organic light-emitting diode ("OLED"), an inorganic light-emitting diode, or a quantum dot light-emitting diode, and for convenience of description, each light-emitting device LE is described below as including an OLED.

The pixel circuit PC may include a plurality of thin-film transistors and a storage capacitor. In an embodiment, as shown in FIG. 4, the pixel circuit PC may include a first thin-film transistor T1, a second thin-film transistor T2, and a storage capacitor Cap. In an embodiment, the first thin-film transistor T1 may be a driving thin-film transistor, and the second thin-film transistor T2 may be a switching thin-film transistor, for example. The second thin-film transistor T2 may be connected to a scan line SL and a data line DL and may transmit a data signal Dm input via the data line DL to the first thin-film transistor T1 according to a scan signal Sn input via the scan line SL.

The storage capacitor Cap may be connected to the second thin-film transistor T2 and a driving voltage line PL and may store a voltage corresponding to a difference between a driving voltage ELVDD applied to the driving voltage line PL and a voltage of the data signal Dm applied to the second thin-film transistor T2.

The first thin-film transistor T1 may be connected to the driving voltage line PL and the storage capacitor Cap and may control a driving current flowing in the light-emitting device LE from the driving voltage line PL in response to a value of a voltage stored in the storage capacitor Cap. A common voltage ELVSS may be applied to an opposite electrode of the light-emitting device LE. The light-emitting device LE may display an image by emitting light having predetermined brightness according to the driving current.

Although a case in which the pixel circuit PC includes two thin-film transistors and one storage capacitor has been described with reference to FIG. 4, the invention is not limited thereto. In an embodiment, the pixel circuit PC may include three or more thin-film transistors and/or two or more storage capacitors, for example. In an embodiment, the pixel circuit PC may include seven thin-film transistors and one storage capacitor. The number of thin-film transistors and storage capacitors may be variously changed according to the design of the pixel circuit PC. However, for convenience of description, a case in which the pixel circuit PC includes two thin-film transistors and one storage capacitor will be described below.

Figure 5:
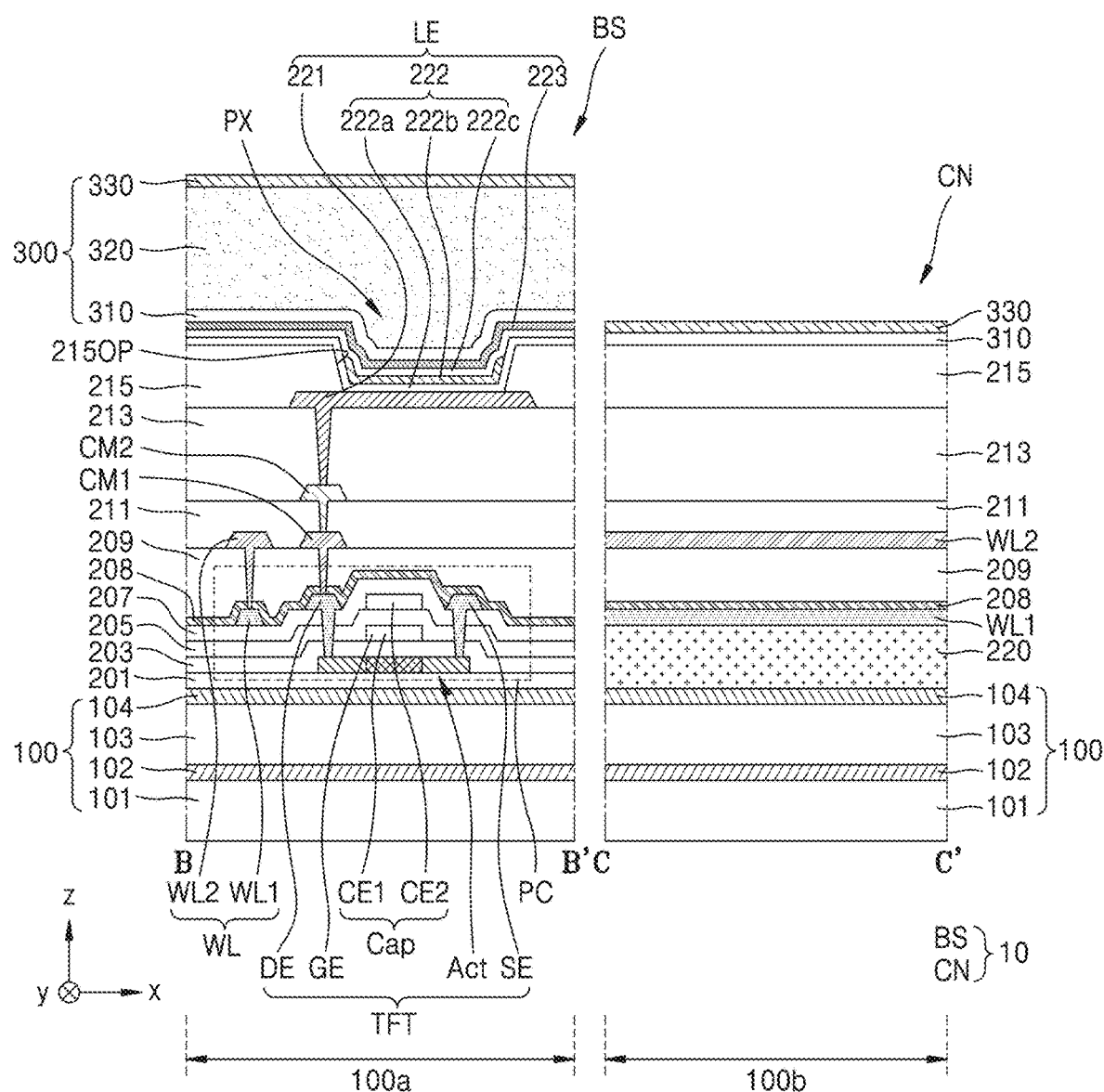
FIG. 5 is a schematic cross-sectional view of an embodiment of a display panel included in a display apparatus.

FIG. 5 is a schematic cross-sectional view of an embodiment of the display panel 10 included in a display apparatus. FIG. 5 is a cross-sectional view of the base portion BS of the display panel 10, taken along line B-B' of FIG. 2, and a cross-sectional view of the connection portion CN of the display panel 10, taken along line C-C' of FIG. 2.

Referring to FIG. 5, the display panel 10 may include the substrate 100. In an embodiment, the substrate 100 may include polymer resin and may be flexible or bendable. In an embodiment, the substrate 100 may include polymer resin such as polyethersulphone, polyacrylate, polyetherimide, polyethylene naphthalate, polyethylene terephthalate, polyphenylene sulfide, polyarylate, polyimide, polycarbonate, or cellulose acetate propionate, for example.

The substrate 100 may have a single-layer or multi-layer structure of the above material, and in the case of a multi-layer structure, may further include an inorganic layer. In an embodiment, the substrate 100 may include a first base layer 101, a first barrier layer 102, a second base layer 103, and a second barrier layer 104 sequentially stacked as shown in FIG. 5, for example. Each of the first base layer 101 and the second base layer 103 may include the above-described polymer resin. In an embodiment, the first barrier layer 102 and the second barrier layer 104 are barrier layers for preventing penetration of external foreign materials and may have a single-layer or multi-layer structure including an inorganic material such as silicon nitride ($SiN_x$), silicon oxide ($SiO_x$) and/or silicon oxynitride ($SiO_xN_y$).

The base portion BS of the display panel 10 may include a buffer layer 201 on the substrate 100. In an embodiment, the buffer layer 201 may include an inorganic insulating material such as silicon nitride ($SiN_x$), silicon oxide ($SiO_x$), or silicon oxynitride ($SiO_xN_y$), and may have single-layer or multi-layer structure including the above-described inorganic insulating material. The buffer layer 201 may increase smoothness of an upper surface of the substrate 100. In addition, the buffer layer 201 may prevent penetration of impurities into a thin-film transistor TFT of the pixel circuit PC described below.

The base portion BS of the display panel 10 may include the pixel circuit PC on the buffer layer 201 and the light-emitting device LE electrically connected to the pixel circuit PC. The pixel circuit PC may include the thin-film transistor TFT and the storage capacitor Cap. The pixel circuit PC and the light-emitting device LE may be in the first area 100*a* of the substrate 100.

The thin-film transistor TFT may include a semiconductor layer Act, a gate electrode GE overlapping a channel region of the semiconductor layer Act, and a source electrode SE and a drain electrode DE respectively connected to a source region and a drain region of the semiconductor layer Act. FIG. 5 shows a top-gate-type thin-film transistor in which the gate electrode GE is arranged above the semiconductor layer Act with a gate insulating layer 203 therebetween. However, in another embodiment, the thin-film transistor TFT may be a bottom-gate-type thin-film transistor.

The semiconductor layer Act may include polysilicon. In some embodiments, the semiconductor layer Act may include amorphous silicon. In some embodiments, the semiconductor layer Act may include oxide of at least one of indium (In), gallium (Ga), stannum (Sn), zirconium (Zr), vanadium (V), hafnium (Hf), cadmium (Cd), germanium (G), chromium (Cr), titanium (Ti) and zinc (Zn). The semiconductor layer Act may include a channel region, and source and drain regions doped with impurities.

The gate electrode GE may include a low-resistance metal material. In an embodiment, the gate electrode GE may include a conductive material including at least one of molybdenum (Mo), aluminum (Al), copper (Cu), titanium (Ti), etc., and may have a multi-layer or single-layer structure including the above material.

In an embodiment, the gate insulating layer 203 between the semiconductor layer Act and the gate electrode GE may include an inorganic insulating material such as silicon oxide ($SiO_2$), silicon nitride ($SiN_x$), silicon oxynitride ($SiO_xN_y$), aluminum oxide ($Al_2O_3$), titanium oxide ($TiO_2$), tantalum oxide ($Ta_2O_5$), hafnium oxide ($HfO_2$), or zinc oxide ($ZnO_x$). In an embodiment, zinc oxide ($ZnO_x$) may be zinc oxide (ZnO) and/or zinc peroxide ($ZnO_2$). The gate insulating layer 203 may have a single-layer or multi-layer structure including the above-described material.

The source electrode SE and the drain electrode DE may be in the same layer, for example, in the same layer directly on a second inter-insulating layer 207, and may include the same material as each other. In an embodiment, the source electrode SE and the drain electrode DE may include a highly conductive material. The source electrode SE and/or the drain electrode DE may include aluminum (Al), platinum (Pt), palladium (Pd), silver (Ag), magnesium (Mg), gold (Au), neodymium (Nd), iridium (Ir), chromium (Cr), nickel (Ni), calcium (Ca), molybdenum (Mo), titanium (Ti), tungsten (W) and/or copper (Cu) and may have a single-layer or multi-layer structure including the above-described material. In an embodiment, the source electrode SE and/or the drain electrode DE may have a three-layer structure of titanium layer/aluminum layer/titanium layer, for example.

The storage capacitor Cap may include a lower electrode CE1 and an upper electrode CE2 overlapping each other with a first inter-insulating layer 205 therebetween. In an embodiment, the storage capacitor Cap may overlap the thin-film transistor TFT, and the gate electrode GE of the thin-film transistor TFT may serve as the lower electrode CE1 of the storage capacitor Cap. In another embodiment, the storage capacitor Cap may not overlap the thin-film transistor TFT. The storage capacitor Cap may be covered by the second inter-insulating layer 207. In an embodiment, the upper electrode CE2 of the storage capacitor Cap may include a conductive material including at least one of molybdenum (Mo), aluminum (Al), copper (Cu), titanium (Ti), etc., and may have a multi-layer or single-layer structure including the above material.

In an embodiment, the first inter-insulating layer 205 and the second inter-insulating layer 207 may be arranged on the gate insulating layer 203 and may include an inorganic insulating material such as silicon oxide ($SiO_2$), silicon nitride ($SiN_x$), silicon oxynitride ($SiO_xN_y$), aluminum oxide ($Al_2O_3$), titanium oxide ($TiO_2$), tantalum oxide ($Ta_2O_5$), hafnium oxide ($HfO_2$), or zinc oxide ($ZnO_x$). The first inter-insulating layer 205 and the second inter-insulating layer 207 may have a single-layer or multi-layer structure including the above-described material.

The source electrode SE and the drain electrode DE may be covered by a passivation layer 208. The passivation layer 208 may be arranged on the second inter-insulating layer 207. In an embodiment, the passivation layer 208 may include an inorganic insulating material such as silicon oxide ($SiO_2$), silicon nitride ($SiN_x$), silicon oxynitride ($SiO_xN_y$), aluminum oxide ($Al_2O_3$), titanium oxide ($TiO_2$), tantalum oxide ($Ta_2O_5$), hafnium oxide ($HfO_2$), or zinc oxide ($ZnO_x$).

At least one planarization layer may be arranged on the pixel circuit PC. In an embodiment, a first planarization layer 209 and a second planarization layer 211 may be sequentially stacked on the pixel circuit PC, and in another example, the first planarization layer 209, the second planarization layer 211, and a third planarization layer 213 may be sequentially stacked. Hereinafter, for convenience of description, a case in which the first planarization layer 209, the second planarization layer 211, and the third planarization layer 213 are sequentially stacked on the pixel circuit PC will be described.

The first planarization layer 209, the second planarization layer 211, and the third planarization layer 213 may include an organic insulating material. In an embodiment, the organic insulating material may include, for example, a general commercial polymer such as benzocyclobutene ("BCB"), polyimide, hexamethyldisiloxane ("HMDSO"), poly(methyl methacrylate) ("PMMA"), or polystyrene ("PS"), a polymer derivative having a phenol-based group, an acryl-based polymer, an imide-based polymer, an aryl ether-based polymer, an amide-based polymer, a fluorine-based polymer, a p-xylene-based polymer, a vinyl alcohol-based polymer, or any combinations thereof, for example.

Wiring WL may include a first wire WL1 and a second wire WL2 electrically connected to each other with the first planarization layer 209 therebetween. In an embodiment, the first wire WL1 and the second wire WL2 may include aluminum (Al), platinum (Pt), palladium (Pd), silver (Ag), magnesium (Mg), gold (Au), neodymium (Nd), iridium (Ir), chromium (Cr), nickel (Ni), calcium (Ca), molybdenum (Mo), titanium (Ti), tungsten (W) and/or copper (Cu) and may have a single-layer or multi-layer structure including the above-described material, for example. When the wiring WL has a multi-layer structure including layers connected to each other with an insulating layer therebetween as described above, an increase in resistance of the wiring WL may be prevented, and a width of the wiring WL may be reduced. In another embodiment, the wiring WL may include only the first wire WL1 or may include only the second wire WL2.

The wiring WL may be used as various signal lines or voltage lines for transmitting an electrical signal or power to the pixel circuit PC, and for example, may be the driving voltage line PL (refer to FIG. 4), the scan line SL (refer to FIG. 4), or the data line DL (refer to FIG. 4).

A pixel electrode 221 may be disposed, for example, on the third planarization layer 213, and may be electrically connected to the thin-film transistor TFT of the pixel circuit PC. In this regard, FIG. 5 shows the thin-film transistor TFT and the pixel electrode 221 electrically connected to each other through a first contact metal CM1 on the first planarization layer 209 and a second contact metal CM2 on the second planarization layer 211. The first contact metal CM1 and the second contact metal CM2 may include a low-resistance metal material, and for example, may include molybdenum (Mo), aluminum (Al), copper (Cu), titanium (Ti), etc.

In an embodiment, the pixel electrode 221 may include transparent conductive oxide such as indium tin oxide ("ITO"), indium zinc oxide ("IZO"), zinc oxide (ZnO), indium oxide ($In_2O_3$), indium gallium oxide ("IGO"), or aluminum zinc oxide ("AZO"). In another embodiment, the pixel electrode 221 may include a reflective film including silver (Ag), magnesium (Mg), aluminum (Al), platinum (Pt), palladium (Pd), gold (Au), nickel (Ni), neodymium (Nd), iridium (Ir), chromium (Cr), or any combinations thereof. In another embodiment, the pixel electrode 221 may further include a film on/under the above-described reflective film and including ITO, IZO, ZnO, or $In_2O_3$. In an embodiment, the pixel electrode 221 may have a three-layer structure in which an ITO layer, an Ag layer, and an ITO layer are stacked, for example.

A pixel-defining layer 215 may be disposed on the pixel electrode 221, for example. The pixel-defining layer 215 may cover an edge of the pixel electrode 221, and an opening 2150P overlapping a central portion of the pixel electrode 221 may be defined in the pixel-defining layer 215. The pixel-defining layer 215 may prevent an arc, etc., at the edge of the pixel electrode 221 from occurring by increasing a distance between the edge of the pixel electrode 221 and an opposite electrode 223 above the pixel electrode 221. In an embodiment, the pixel-defining layer 215 may include an organic insulating material such as polyimide, polyamide, acrylic resin, BCB, hexamethyldisiloxane ("HMDSO"), or phenolic resin.

An intermediate layer 222 corresponding to the pixel electrode 221 may be disposed on the pixel-defining layer 215. The intermediate layer 222 may be disposed between the pixel electrode 221 and the opposite electrode 223.

The intermediate layer 222 may include an emission layer 222b. In an embodiment, the emission layer 222b may include an organic light-emitting material such as a polymer organic material or low-molecular-weight organic material emitting light of a predetermined color. In an alternative embodiment, the emission layer 222b may include an inorganic light-emitting material or may include quantum dots.

A first functional layer 222a and a second functional layer 222c may be arranged respectively under and above the emission layer 222b. The first functional layer 222a may have a single-layer or multi-layer structure. In an embodiment, the first functional layer 222a may be a hole transport layer ("HTL") having a single-layer structure and may include poly(3,4-ethylenedioxythiophene) ("PEDOT") or polyaniline ("PANT"), for example. In an alternative embodiment, the first functional layer 222a may include a hole injection layer ("HIL") and an HTL. The second functional layer 222c may have a single-layer or multi-layer structure. The second functional layer 222c may include an electron transport layer ("ETL") and/or an electron injection layer ("EIL").

FIG. 5 shows the intermediate layer 222 including both of the first functional layer 222a and the second functional layer 222c. However, in another embodiment, the intermediate layer 222 may optionally include the first functional layer 222a and the second functional layer 222c. In another embodiment, the intermediate layer 222 may not include the second functional layer 222c, for example.

While the emission layer 222b of the intermediate layer 222 is disposed for each pixel PX, the first functional layer 222a and the second functional layer 222c may be unitarily provided to cover a plurality of pixels PX. In an embodiment, the first functional layer 222a and the second functional layer 222c may each be unitarily provided to cover the red, green, and blue pixels PXr, PXg, and PXb (refer to FIG. 2), for example.

The opposite electrode 223 may be disposed above the pixel electrode 221 and may overlap the pixel electrode 221. The opposite electrode 223 may include a conductive material having a low work function. In an embodiment, the opposite electrode 223 may include a (semi)transparent layer including silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), or an alloy thereof, for example. In an alternative embodiment, the opposite electrode 223 may further include a layer, such as ITO, IZO, ZnO, or $In_2O_3$, on a (semi)transparent layer including the above-described material. The opposite electrode 223 may be unitarily provided to cover a plurality of pixels, for example, to cover the red, green, and blue pixels PXr, PXg, and PXb (refer to FIG. 2).

A stacked structure of the pixel electrode 221, the intermediate layer 222, and the opposite electrode 223 may constitute an OLED as the light-emitting device LE. The OLED may emit red, green, or blue light. Because the opening 2150P of the pixel-defining layer 215 defines a size and/or width of an emission area, a size and/or width of the pixel PX may depend on a size and/or width of the opening 2150P of the corresponding pixel-defining layer 215.

A structure of the light-emitting device LE shown in FIG. 5 may be equally applied to the pixels PX emitting light of different colors. However, because a color of light emitted by an emission layer provided for each pixel PX varies, predetermined materials of the emission layer may vary according to each pixel PX.

A capping layer (not shown) may be on the opposite electrode 223. The capping layer may include lithium fluoride (LiF). In an alternative embodiment, a capping layer (not shown) may include an inorganic insulating material such as silicon nitride and/or may include an organic insulating material. In some embodiments, a capping layer (not shown) may be omitted.

The opposite electrode 223 may be covered by an encapsulation layer 300. The encapsulation layer 300 may include at least one inorganic encapsulation layer and at least one organic encapsulation layer. In an embodiment, the encapsulation layer 300 may include a first inorganic encapsulation layer 310, an organic encapsulation layer 320, and a second inorganic encapsulation layer 330 that are sequentially stacked.

In an embodiment, the first and second inorganic encapsulation layers 310 and 330 may include one or more inorganic insulating materials including at least one of aluminum oxide ($Al_2O_3$), titanium oxide ($TiO_2$), tantalum oxide ($Ta_2O_5$), zinc oxide ($ZnO_x$), silicon oxide ($SiO_2$), silicon nitride ($SiN_x$), and silicon oxynitride ($SiO_xN_y$). The first and second inorganic encapsulation layers 310 and 330 may be formed or provided through chemical vapor deposition.

The organic encapsulation layer 320 may include a polymer-based material. Examples of the polymer-based material may include acryl-based resin, epoxy-based resin, polyimide, and polyethylene. The acryl-based resin may include, for example, PMMA, polyacrylic acid, etc. The organic encapsulation layer 320 may be formed or provided by curing monomers or applying polymers. The organic encapsulation layer 320 may have transparency. The organic encapsulation layer 320 may be disposed only in each base portion BS.

The connection portion CN of the display panel 10 may include an organic material layer 220 on the substrate 100. Although not shown, the organic material layer 220 may cover edge portions of the buffer layer 201, the gate insulating layer 203, the first inter-insulating layer 205, and the second inter-insulating layer 207 of the base portion BS of the display panel 10. In an embodiment, the organic material layer 220 may cover edges of the buffer layer 201, the gate insulating layer 203, the first inter-insulating layer 205, and the second inter-insulating layer 207 having a step difference with respect to the upper surface of the substrate 100, for example. The organic material layer 220 may relax stress of inorganic insulating material layers touching each other near an edge portion of the substrate 100, for example, an edge of the base portion BS. In an embodiment, the organic material layer 220 may include an organic insulating material such as polyimide.

The connection portion CN of the display panel 10 may include the above-described wiring WL. That is, the wiring WL may be in the second area 100b of the substrate 100. In an embodiment, the first wire WL1 may be disposed on the organic material layer 220 and may be covered by the passivation layer 208, for example. The second wire WL2 may be disposed between the first planarization layer 209 and the second planarization layer 211. The wiring WL may extend in an extension direction of the connection portion CN and may electrically connect a plurality of pixel circuits PC respectively provided in the plurality of base portions BS to each other.

The connection portion CN of the display panel 10 may include the third planarization layer 213 and the pixel-defining layer 215, on the second planarization layer 211. In addition, the connection portion CN of the display panel 10 may include the first inorganic encapsulation layer 310 and the second inorganic encapsulation layer 330 on the pixel-defining layer 215 but may not include an organic encapsulation layer. Accordingly, there may be a predetermined thickness difference between the base portion BS and the connection portion CN of the display panel 10.

Figure 6:
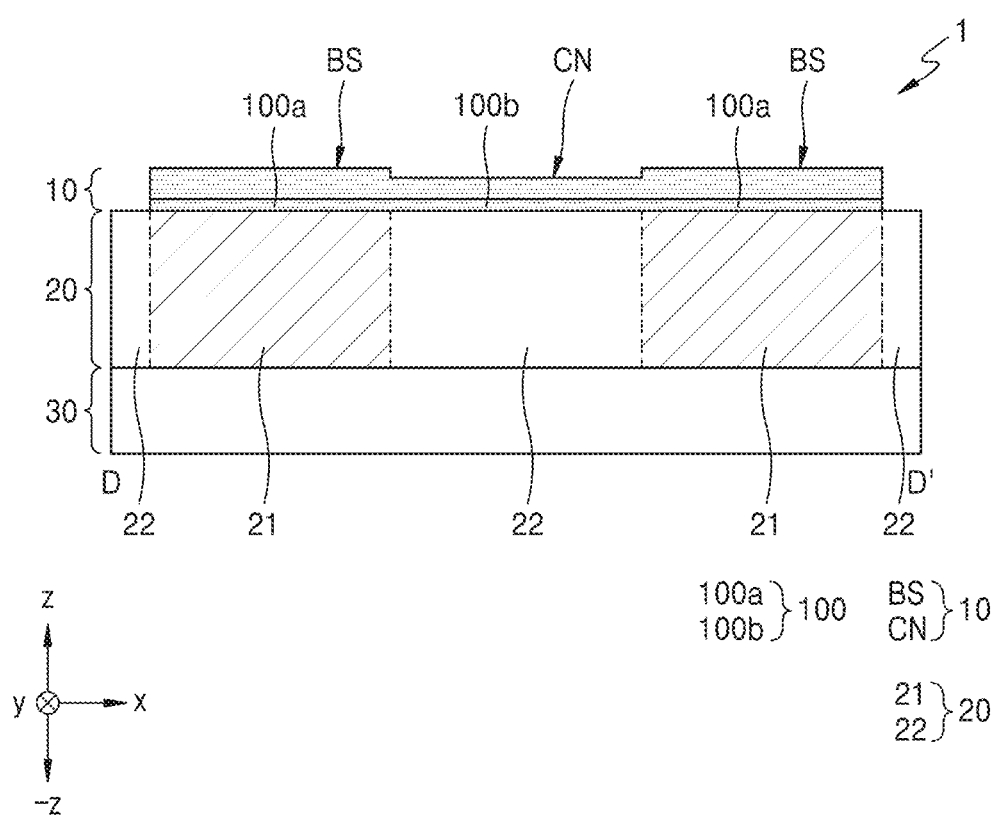
FIG. 6 is a schematic cross-sectional view of an embodiment of a display apparatus, taken along line D-D' of FIG. 2.
Figure 7A:
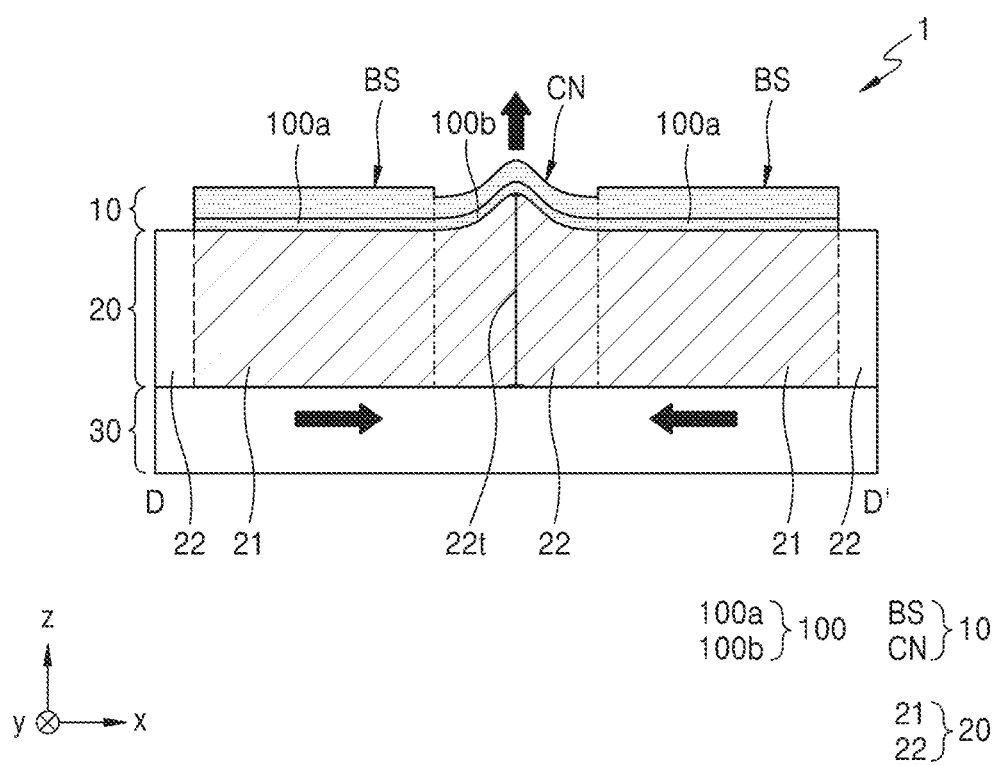
FIG. 7A is a schematic cross-sectional view of the display apparatus of FIG. 6 in a contracted state.
Figure 7B:
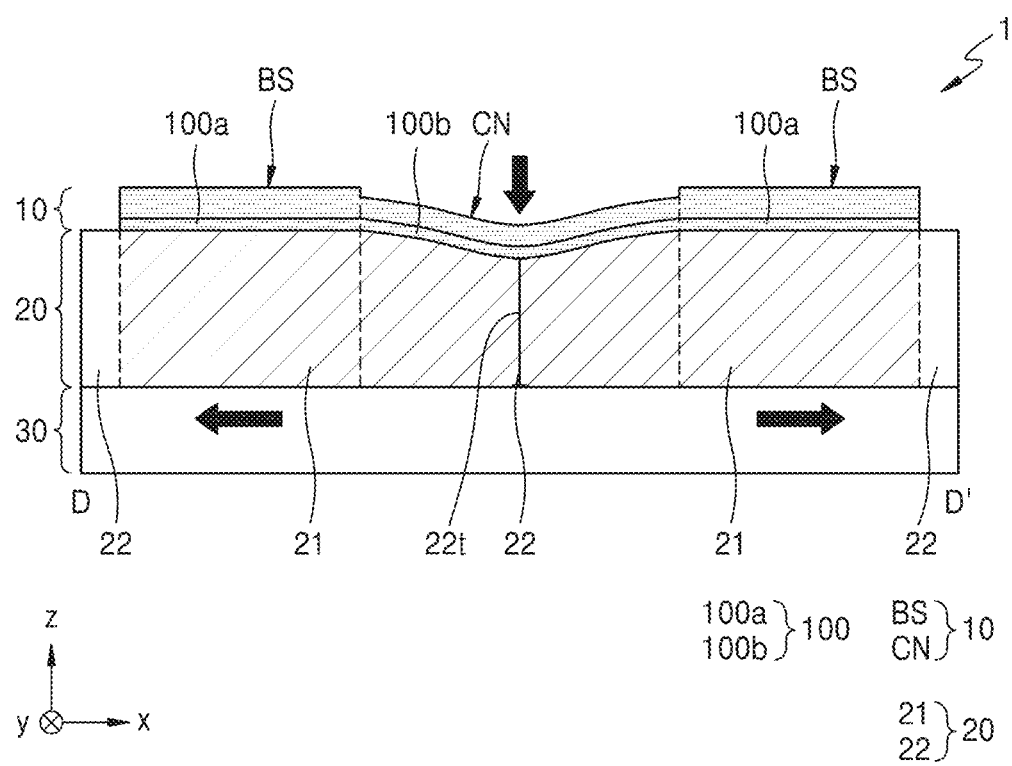
FIG. 7B is a schematic cross-sectional view of the display apparatus of FIG. 6 in a stretched state.
Figure 8:
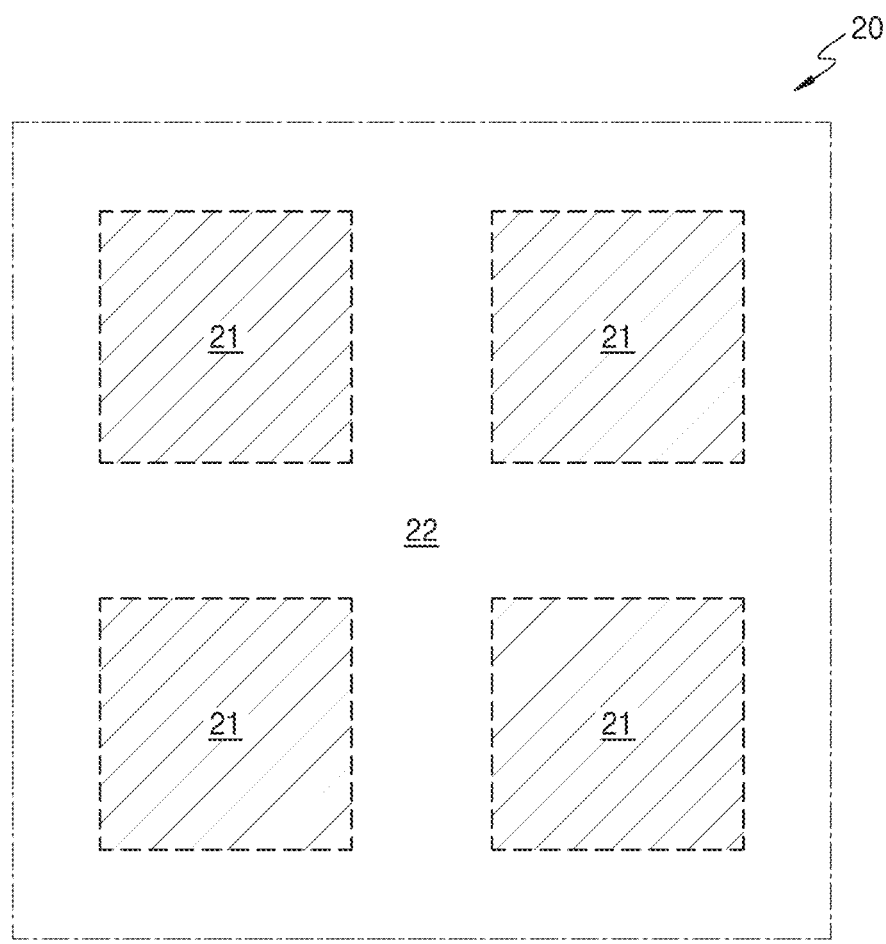
FIG. 8 is a schematic plan view of a first member included in the display apparatus of FIG. 6.

FIG. 6 is a schematic cross-sectional view of an embodiment of the display apparatus 1, taken along line D-D' of FIG. 2. FIG. 7A is a schematic cross-sectional view of the display apparatus 1 of FIG. 6 in a contracted state. FIG. 7B is a schematic cross-sectional view of the display apparatus 1 of FIG. 6 in a stretched state. FIG. 8 is a schematic plan view of a first member 20 included in the display apparatus 1 of FIG. 6.

Referring to FIG. 6, the display apparatus 1 may include not only the display panel 10 described above but also the first member 20 and a second member 30 arranged under the display panel 10.

The first member 20 may be disposed under the display panel 10 and may include a first portion 21 overlapping the base portion BS of the display panel 10 and a second portion 22 overlapping the plurality of connection portions CN of the display panel 10. In other words, the first member 20 may include the first portion 21 overlapping the first area 100a of the substrate 100 and the second portion 22 overlapping the second area 100b of the substrate 100. In some embodiments, the first member 20 may include polymer resin such as polyimide.

A modulus of the second portion 22 of the first member 20 may be less than that of the first portion 21 of the first member 20. In an embodiment, the first portion 21 of the first member 20 may include a material having a relatively high modulus, and the second portion 22 may include a material having a relatively low modulus. In an alternative embodiment, the first portion 21 and the second portion 22 of the first member 20 may include the same material as each other, but a modulus of the first portion 21 may be made greater than that of the second portion 22 through local heat treatment, etc.

The first member 20 may support the display panel 10 and may control deformation of the display panel 10. In an embodiment, the first portion 21 of the first member 20 resists deformation by an external force because of its relatively high modulus and thus may support the base portion BS thereon so that the base portion BS may hold stable without being deformed, for example. The second portion 22 of the first member 20 has a relatively low modulus and thus may be relatively easily deformed by an external force and be flexible. Accordingly, the second portion 22 of the first member 20 supports the connection portion CN thereon but may be deformed together with the connection portion CN, thereby helping control a deformation shape of the connection portion CN.

In an embodiment, an upper surface of the second portion 22 of the first member 20 may be attached to the plurality of connection portions CN of the display panel 10. That is, an upper surface of the second portion 22 of the first member 20 may be attached to the plurality of second areas 100b of the substrate 100 of the display panel 10. In an embodiment, the second portion 22 of the first member 20 may include a material having pressure-sensitive adhesion or adhesion, for example. Thus, even when the display apparatus 1 contracts or stretches, the second portion 22 of the first member 20 and the connection portion CN of the display panel 10 may not be spaced apart from each other, and the second portion 22 may precisely control deformation of the connection portion CN.

In an embodiment, a thickness of the first member 20 may be about 1 micrometer (μm) to about 1000 μm. When a thickness of the first member 20 is less than about 1 μm, it may be difficult to sufficiently support the display panel 10. In addition, when a thickness of the first member 20 is greater than about 1000 μm, it may be difficult to precisely control deformation of the display panel 10. In consideration of these points, a thickness of the first member 20 may be determined in a range of about 1 μm to about 1000 μm.

The plurality of connection portions CN may be contracted and/or stretched. In an embodiment, the plurality of connection portions CN may be deformed in a third direction (e.g., the direction z), and distances between a plurality of adjacent base portions BS may decrease or increase, for example. In this case, the first member 20 may control deformation of the plurality of connection portions CN.

Unlike embodiments, in a case where the first member 20 is not disposed under the display panel 10, a degree of deformation of the plurality of connection portions CN and/or a direction in which the plurality of connection portions CN is deformed may not be uniform when a contracting force and/or a stretching force is externally applied to the display panel 10. The plurality of connection portions CN may be randomly deformed in any one of the direction z and direction −z of FIG. 6, for example.

In the illustrated embodiment, the first member 20 is disposed under the display panel 10, and accordingly, a degree of deformation of the plurality of connection portions CN and/or a direction in which the plurality of connection portions CN is deformed may be uniformly controlled when a contracting force and/or a stretching force is applied from outside the display panel 10.

The second member 30 is disposed under the first member 20 and may overlap both of the first portion 21 and the second portion 22 of the first member 20. In an embodiment, a modulus of the second member 30 may be less than that of the first portion 21 of the first member 20. The second member 30 may be, for example, a heat-shrinkable film, and may include polyethylene terephthalate. The second member 30 may support the first member 20. In addition, the second member 30 may transmit a compressive force or a tensile force when the display apparatus 1 is contracted or stretched.

Referring to FIGS. 7A and 7B, the second portion 22 of the first member 20 may include elastomer having a positive Poisson's ratio. When a transverse tensile force is applied to a member, deformation in transverse and longitudinal directions occur. In this regard, a negative ratio between transverse strain and longitudinal strain is defined as Poisson's ratio. The second portion 22 of the first member 20 may have a positive Poisson's ratio, and signs of transverse strain and longitudinal strain may be different from each other. That is, when a transverse tensile force is applied to the second portion 22 of the first member 20, transverse elongation and longitudinal contraction may occur.

In an embodiment, as shown in FIG. 7A, when a compressive force acts on a portion of the display apparatus 1, two first portions 21 of the first member 20 neighboring each other may move closer to each other, and accordingly, two base portions BS of the display panel 10 neighboring each other also move closer to each other, for example. In this regard, the second portion 22 of the first member 20 between the two first portions 21 has a positive Poisson's ratio and thus may be contracted in a first direction (e.g., the direction x) or a second direction (e.g., the direction y) and stretched in a third direction (e.g., the direction z). In this regard, the first direction and the second direction may be parallel to one surface of the first member 20, and the third direction may be perpendicular to one surface of the first member 20. In other words, the first portion 21 may be provided in plural, and the second portion 22 may be disposed between adjacent first portions 21 arranged side by side. When the adjacent first portions 21 come close to each other in a direction along which the adjacent first portions 21 are arranged side by side, a thickness 22t of the second portion 22 may increase in a direction perpendicular to the direction along which the adjacent first portions 21 are arranged side by side. The thickness 22t of the second portion 22 may be a distance between an upper surface of the second portion 22 facing the display panel 10 in the third direction (e.g., the direction z) and a lower surface of the second portion 22 opposite to the upper surface of the second portion 22. In an embodiment, a lower surface of the second portion 22 may face the second member 30. In an embodiment, when the adjacent first portions 21 come close to each other in the first direction (e.g., the direction x), the thickness 22t of the second portion 22 may increase in the third direction (e.g., the direction z), for example. Accordingly, the connection portion CN of the display panel 10 on the second portion 22 of the first member 20 may be deformed upwardly, and may be stably deformed into an intended shape while being supported by the second portion 22 of the first member 20.

In addition, as shown in FIG. 7B, when a tensile force acts on a portion of the display apparatus 1, two first portions 21 of the first member 20 neighboring each other may move farther away from each other, and accordingly, two base portions BS of the display panel 10 neighboring each other also move farther away from each other. In this regard, the second portion 22 of the first member 20 between the two first portions 21 may be stretched in the first direction (e.g., the direction x) or the second direction (e.g., the direction y) and contracted in the third direction (e.g., the direction z). In other words, when the adjacent first portions 21 move away from each other in a direction along which the adjacent first portions 21 are arranged side by side, a thickness 22t of the second portion 22 may decrease in a direction perpendicular to the direction along which the adjacent first portions 21 are arranged side by side. In an embodiment, when the adjacent first portions 21 move away from each other in the first direction (e.g., the direction x), a thickness 22t of the second portion 22 may decrease in the third direction (e.g., the direction z), for example. Accordingly, the connection portion CN of the display panel 10 on the second portion 22 of the first member 20 may be deformed downwardly, and may be stably deformed into an intended shape while being supported by the second portion 22 of the first member 20.

Thus, even when a great tensile force or compressive force is applied to the display apparatus 1, or the display apparatus 1 is stretched or contracted in only one direction, the plurality of connection portions CN of the display panel 10 may be prevented from being abnormally distorted or cracked. Further, the display panel 10 may have a structure that is stably and highly stretchable and contractible.

Referring to FIG. 8, the first portion 21 of the first member 20 may have a shape corresponding to the base portion BS (refer to FIGS. 6 to 7B) of the display panel 10 in a plan view. That is, the first portion 21 of the first member 20 may have a shape corresponding to the first area 100a (refer to FIGS. 6 to 7B) of the substrate 100 (refer to FIGS. 6 to 7B). The second portion 22 of the first member 20 is a portion of the first member 20 excluding the first portion 21 and may surround an entirety of the first portions 21.

In an embodiment, an area size of the first portion 21 of the first member 20 may be the same as or greater than that of the base portion BS of the display panel 10 so that the first portion 21 of the first member 20 may support an entirety of the base portion BS of the display panel 10. That is, an entirety of the base portion BS of the display panel 10 is supported by the first portion 21 of the first member 20 having a relatively high modulus and thus may have reduced deformation unlike the connection portion CN.

Figure 9:
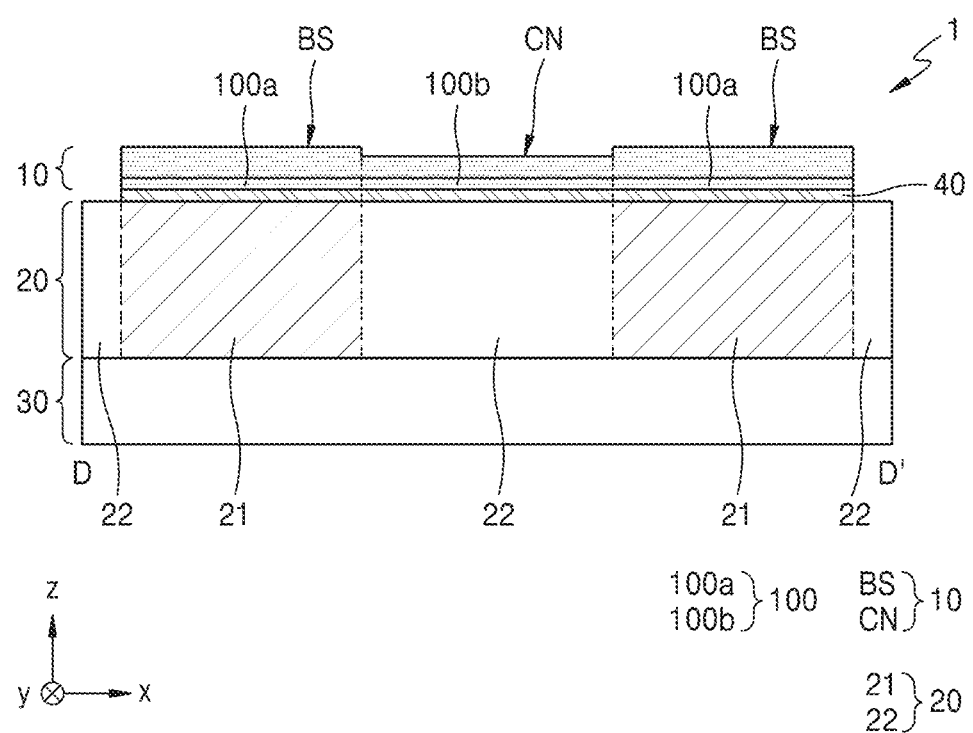
FIG. 9 is a schematic cross-sectional view of another embodiment of a display apparatus, taken along line D-D' of FIG. 2.

FIG. 9 is a schematic cross-sectional view of another embodiment of the display apparatus 1, taken along line D-D' of FIG. 2.

Referring to FIG. 9, the display apparatus 1 may further include an adhesive layer 40 between the display panel 10 and the first member 20. The adhesive layer 40 allows the display panel 10 and the first member 20 to be firmly attached to each other. In an embodiment, the adhesive layer 40 may be an optically clear adhesive ("OCA") or a pressure-sensitive adhesive ("PSA"), for example, but any general adhesive member known in the art may be employed as the adhesive layer 40 without limitation.

Figure 10:
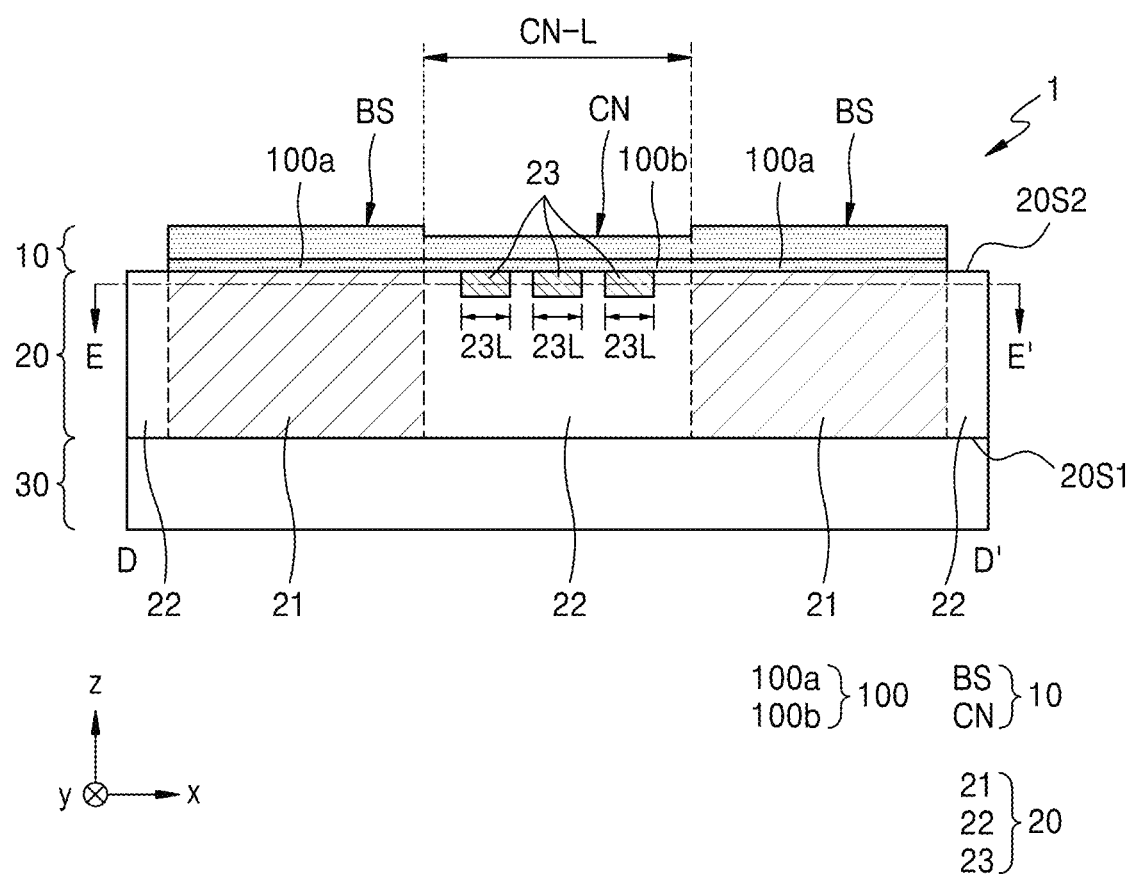
FIG. 10 is a schematic cross-sectional view of another embodiment of a display apparatus, taken along line D-D' of FIG. 2.

FIG. 10 is a schematic cross-sectional view of another embodiment of the display apparatus 1, taken along line D-D' of FIG. 2.

Referring to FIG. 10, the first member 20 of the display apparatus 1 may further include a third portion 23 overlapping each of the plurality of connection portions CN of the display panel 10 and having a different modulus from that of the second portion 22 of the first member 20.

In an embodiment, a modulus of the third portion 23 of the first member 20 may be greater than that of the second portion 22 of the first member 20. In this case, a supporting force on the connection portion CN supported by the third portion 23 may be strengthened. In another embodiment, a modulus of the third portion 23 of the first member 20 may be less than that of the second portion 22 of the first member 20. In this case, deformation of the connection portion CN may be precisely controlled instead of relaxing a supporting force on the connection portion CN supported by the third portion 23.

The third portion 23 of the first member 20 may be closer to an upper surface 20S2 of the first member 20 than to a lower surface 20S1 of the first member 20 in a cross-sectional view. In an embodiment, as shown in FIG. 10, an upper surface of the third portion 23 of the first member 20 may coincide with that of the second portion 22. In another embodiment, an upper surface of the third portion 23 of the first member 20 does not coincide with that of the second portion 22 and is inside the second portion 22, and the third portion 23 may be at an upper portion of the second portion 22. In other words, the third portion 23 of the first member 20 may be closer to the display panel 10 than to the second member 30. This is because a supporting effect or deformation-controlling effect of the third portion 23 on the connection portion CN of the display panel 10 increases as the third portion 23 is closer to the display panel 10.

The third portion 23 of the first member 20 may be between first portions 21 adjacent to each other in a plan view. In addition, a length 23L of the third portion 23 of the first member 20 in a first direction (e.g., the direction x) may be equal to or less than a length CN-L of a corresponding connection portion CN of the display panel 10 in the first direction (e.g., the direction x).

Figure 11A:
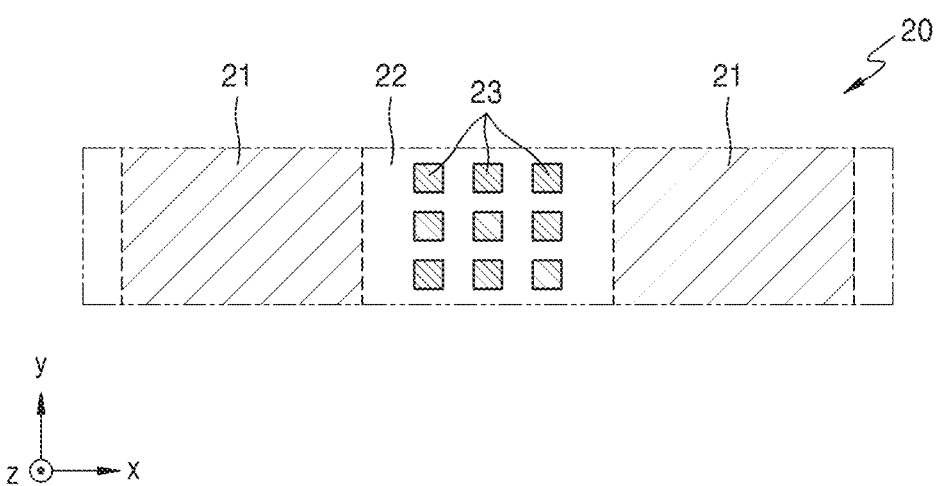
FIGS. 11A to 11C are schematic plan views of embodiments of a first member of a display apparatus.
Figure 11B:
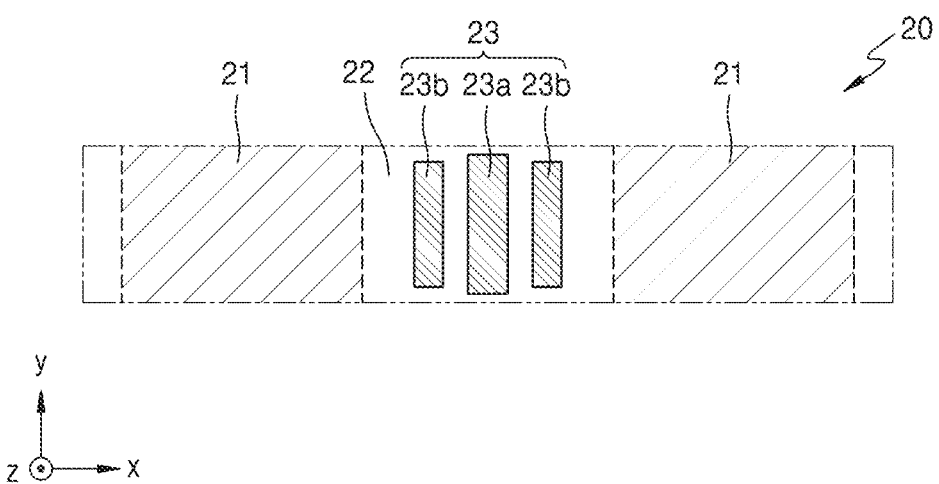
Figure 11C:
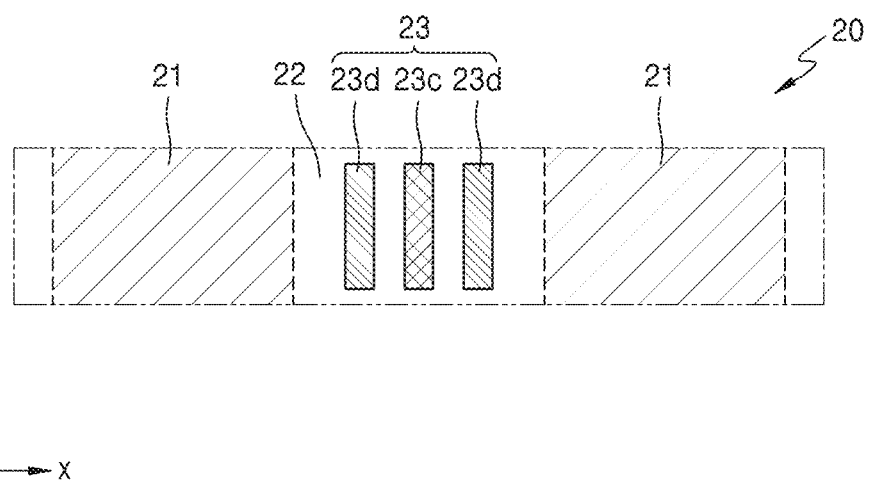

FIGS. 11A to 11C are schematic plan views of embodiments of the first member 20 of a display apparatus. FIGS. 11A to 11C are plan views of the first member 20, corresponding to line E-E' of FIG. 10.

Referring to FIG. 11A, the third portion 23 of the first member 20 may be provided in plural, and a plurality of third portions 23 may be arranged in a first direction (e.g., the direction x) and a second direction (e.g., the direction y) crossing the first direction in a plan view. That is, the third portions 23 may be arranged in a matrix with rows and columns. Although FIG. 11A shows all of the third portions 23 having the same shape and area size, the invention is not limited thereto, and the third portions 23 may have different shapes and area sizes. That is, in embodiments, the third portions 23 may have various shapes such as a circle, an oval, a polygon such as a triangle, a rectangle, a square, etc., and an atypical shape, and may have different areas.

Referring to FIG. 11B, the third portion 23 of the first member 20 may include a 3-1 portion 23a and a 3-2 portion 23b spaced apart from each other and having different area sizes from each other in a plan view. In an embodiment, the 3-1 portion 23a may have a larger area size than that of the 3-2 portion 23b, for example. In an embodiment, two 3-2 portions 23b may be arranged on both sides of the 3-1 portion 23a with the 3-1 portion 23a therebetween.

As described above, a planar shape of the third portion 23 may be variously modified. Thus, a supporting force on a portion of the connection portion CN (refer to FIG. 10) of the display panel 10 (refer to FIG. 10) may be intensively strengthened or relaxed. Thus, the connection portion CN may be adjusted so as to be deformed into an intended shape.

Referring to FIG. 11C, the third portion 23 of the first member 20 may include a 3-3 portion 23c and a 3-4 portion 23d spaced apart from each other in a plan view and having different Poisson's ratios from each other. In an embodiment, an absolute value of the Poisson's ratio of the 3-3 portion 23c may be greater than an absolute value of the Poisson's ratio of the 3-4 portion 23d, for example. In this case, the 3-3 portion 23c has great strain in a third direction (e.g., the direction z) compared to the 3-4 portion 23d, and accordingly, the connection portion CN of the display panel 10 corresponding to the 3-3 portion 23c may be greatly deformed. Thus, the connection portion CN may be adjusted so as to be deformed into an intended shape.

Although the display apparatus has been mainly described above, the invention is not limited thereto. A method of manufacturing the display apparatus may also be encompassed in the disclosure, for example.

According to one or more of the above embodiments, a display apparatus that is highly contractible and stretchable may be implemented. In addition, a display apparatus in which deformation of a display panel due to contraction and stretching is controllable may be implemented. However, the invention is not limited by such effects.

It should be understood that embodiments described herein should be considered in a descriptive sense only and not for purposes of limitation. Descriptions of features or advantages within each embodiment should typically be considered as available for other similar features or advantages in other embodiments. While embodiments have been described with reference to the drawing figures, it will be understood by those of ordinary skill in the art that various changes in form and details may be made therein without departing from the spirit and scope as defined by the following claims.

What is claimed is:

1. A display apparatus comprising:
 a display panel comprising:
  a base portion; and
  a plurality of connection portions extending from the base portion in different directions; and
 a first member disposed on a surface of the display panel and comprising:
  a first portion overlapping the base portion of the display panel; and
  a second portion overlapping the plurality of connection portions of the display panel,
 wherein a modulus of the second portion of the first member is less than a modulus of the first portion of the first member, and
 the first member further comprises a third portion overlapping each of the plurality of connection portions of the display panel and having a different modulus from the modulus of the second portion of the first member.

2. The display apparatus of claim 1, further comprising a second member disposed on a first surface of the first member and overlapping the first portion and the second portion of the first member, the first surface of the first member being opposite to a second surface of the first member facing the surface of the display panel,
 wherein a modulus of the second member is less than a modulus of the first portion of the first member.

3. The display apparatus of claim 1, wherein the second portion of the first member comprises elastomer having a positive Poisson's ratio.

4. The display apparatus of claim 1, wherein an area size of the first portion of the first member is equal to or greater than an area size of the base portion of the display panel.

5. The display apparatus of claim 1, wherein a thickness of the first member is about 1 micrometer to about 1000 micrometers.

6. The display apparatus of claim 1, wherein a surface of the second portion of the first member facing the display panel is attached to the plurality of connection portions of the display panel.

7. The display apparatus of claim 1, further comprising an adhesive layer between the display panel and the first member.

8. The display apparatus of claim 1, wherein the first portion is provided in plural to comprise a plurality of first portions,
 wherein the second portion is disposed between adjacent first portions of a plurality of first portions arranged side by side,
 wherein a thickness of the second portion is capable of increasing in a direction perpendicular to the direction along which the adjacent first portions are being arranged side by side when the adjacent first portions come close to each other in a direction along which the adjacent first portions are arranged side by side.

9. The display apparatus of claim 1, wherein the third portion of the first member is closer to a second surface of the first member facing the display panel than to a first surface of the first member opposite to the second surface of the first member in a cross-sectional view.

10. The display apparatus of claim 1, wherein a length of the third portion of the first member in a first direction is equal to or less than a length of a corresponding connection portion from among the plurality of connection portions of the display panel in the first direction.

11. The display apparatus of claim 1, wherein the third portion of the first member is provided in plural to comprise a plurality of third portions, and the plurality of third portions is arranged in a first direction and a second direction crossing the first direction in a plan view.

12. The display apparatus of claim 1, wherein the third portion of the first member comprises a 3-1 portion and a 3-2 portion spaced apart from each other and having different area sizes from each other in a plan view.

13. The display apparatus of claim 1, wherein the third portion of the first member comprises a 3-3 portion and a 3-4 portion spaced apart from each other in a plan view and having different Poisson's ratios from each other.

14. A display apparatus comprising:
 a substrate comprising:
  a first area; and
  a plurality of second areas extending from the first area in different directions;
 a pixel circuit disposed in the first area of the substrate and comprising:
  a plurality of thin-film transistors; and
  a storage capacitor;
 a light-emitting device disposed in the first area of the substrate and electrically connected to the pixel circuit;
 wiring which is disposed in a second area of the second areas of the substrate and applies an electrical signal to the pixel circuit;
 a first member disposed on a surface of the substrate and comprising:
  a first portion overlapping the first area of the substrate; and
  a second portion overlapping the plurality of second areas of the substrate; and
 a second member disposed on a first surface of the first member, the first surface of the first member being opposite to a second surface of the first member facing the surface of the substrate,
 wherein a modulus of the second portion of the first member and a modulus of the second member are less than a modulus of the first portion of the first member, and
 the first member further comprises a third portion overlapping each of the plurality of second areas of the substrate and having a different modulus from the modulus of the second portion of the first member.

15. The display apparatus of claim 14, wherein an area size of the first portion of the first member is equal to or greater than an area size of the first area of the substrate.

16. The display apparatus of claim 14, wherein a thickness of the first member is about 1 micrometer to about 1000 micrometers.

17. The display apparatus of claim 14, wherein a surface of the second portion of the first member facing the substrate is attached to the plurality of second areas of the substrate.

18. The display apparatus of claim 14, wherein the third portion of the first member is closer to the first surface of the first member facing the substrate than to the second surface of the first member opposite to the first surface of the first member in a cross-sectional view.

19. The display apparatus of claim 14, wherein a length of the third portion of the first member in a first direction is equal to or less than a length of a corresponding second area from among the plurality of second areas of the substrate in the first direction.

20. The display apparatus of claim 14, wherein the third portion of the first member is provided in plural to comprise a plurality of third portions, and the plurality of third portions is arranged in a first direction and a second direction crossing the first direction in a plan view.

21. The display apparatus of claim 14, wherein the third portion of the first member comprises a 3-1 portion and a 3-2 portion spaced apart from each other and having different area sizes from each other in a plan view.

\* \* \* \* \*